United States Patent [19]
van Lintel

[11] Patent Number: 5,316,618
[45] Date of Patent: May 31, 1994

[54] ETCHING METHOD FOR OBTAINING AT LEAST ONE CAVITY IN A SUBSTRATE

[75] Inventor: Harald T. G. van Lintel, Enschede, Netherlands

[73] Assignee: Westonbridge International Limited, Dublin, Ireland

[21] Appl. No.: 784,430

[22] PCT Filed: Mar. 7, 1991

[86] PCT No.: PCT/EP91/00426

§ 371 Date: Nov. 12, 1991

§ 102(e) Date: Nov. 12, 1991

[87] PCT Pub. No.: WO91/14181

PCT Pub. Date: Sep. 19, 1991

[30] Foreign Application Priority Data

Mar. 16, 1990 [CH] Switzerland .................... 00872/90-9

[51] Int. Cl.⁵ ............................................ H01L 21/00
[52] U.S. Cl. .................................. 156/644; 156/647; 156/651; 156/659.1; 156/661.1; 156/662
[58] Field of Search ...................... 156/647, 626, 659.1, 156/644, 662, 661.1, 651

[56] References Cited

U.S. PATENT DOCUMENTS

| | | | |
|---|---|---|---|
| 3,844,858 | 10/1974 | Bean | 156/647 X |
| 4,761,210 | 8/1988 | Ehrler et al. | 156/661.1 X |
| 4,836,888 | 6/1989 | Nojiri et al. | 156/647 |
| 4,899,178 | 2/1990 | Tellier | 156/647 X |
| 4,957,592 | 9/1990 | O'Neill | 156/644 |
| 5,024,953 | 6/1991 | Uematsu et al. | 156/647 X |

FOREIGN PATENT DOCUMENTS

0217071 4/1987 European Pat. Off. .
3225206 10/1983 Fed. Rep. of Germany .
58-98927 6/1983 Japan .

OTHER PUBLICATIONS

Article entitled "A Piezoelectric Micropump Based on Micromachining of Silicon" by H. van Lintel, et al, *Sensors and Actuators*, vol. 15, pp. 153-167, 1988.

Article entitled "An IC Piezoresistive Pressure Sensor for Biomedical Instruments", by Samaun et al, *IEEE Transactions on Biomedical Engineering*, vol. BME-20, Nr. 3, pp. 101-107, Mar. 1973.

Article entitled "Novel V-groove structures on Silicon" by S. Siriam, vol. 24, No. 12, pp. 1784-1787, 15 Jun. 1985, New York, USA.

*Primary Examiner*—Thi Dang
*Attorney, Agent, or Firm*—Pollock, Vande Sande & Priddy

[57] ABSTRACT

Flat-bottomed cavities are formed in a substrate (2) by a method comprising two etching steps: a first anisotropic etching through a mask (4) leaving exposed bands (6,8) of the substrate (2) and a second anisotropic etching through a mask leaving exposed all of the zones (Z1, Z2) to be etched. The first etching provides grooves in V form (10,12), the depth of $X_1$, $X_2$) which depends on the width of the bands, while the second etching increased the depth of the cavities by the same amount y, in eliminating the bands located between the grooves. Advantage: flat cavities of different depths may be obtained simultaneously.

20 Claims, 4 Drawing Sheets

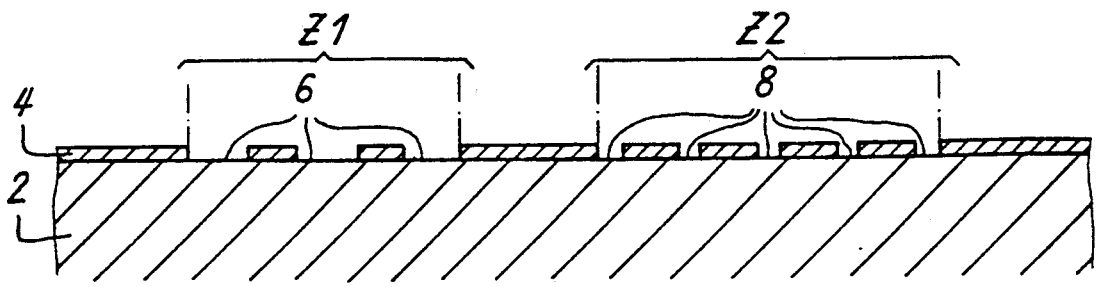
Fig.1a
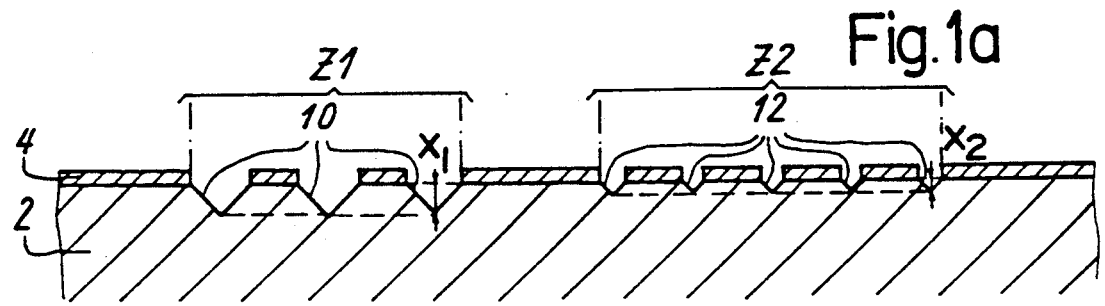
Fig.1b
Fig.1c
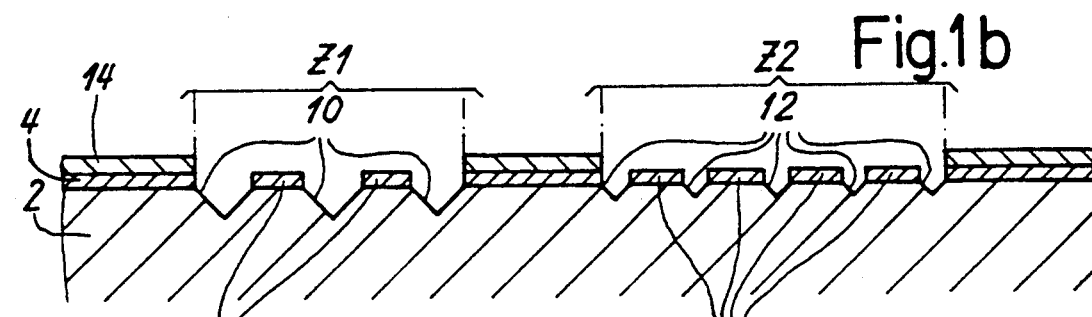
Fig.1d
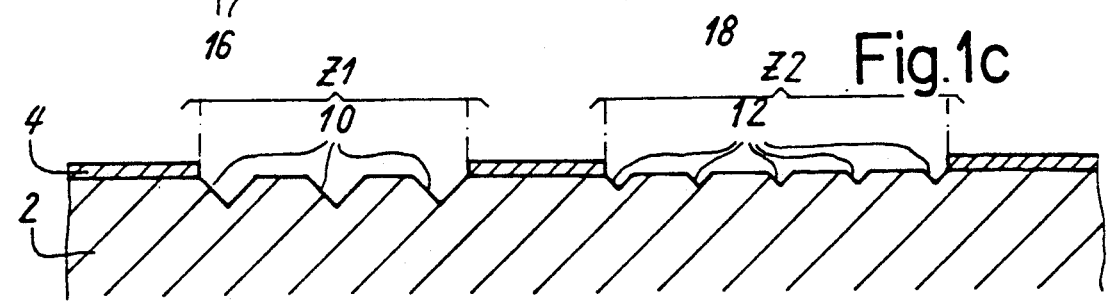
Fig.1e

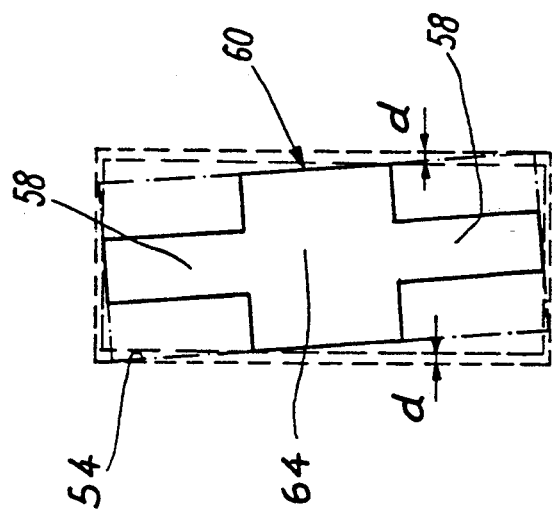
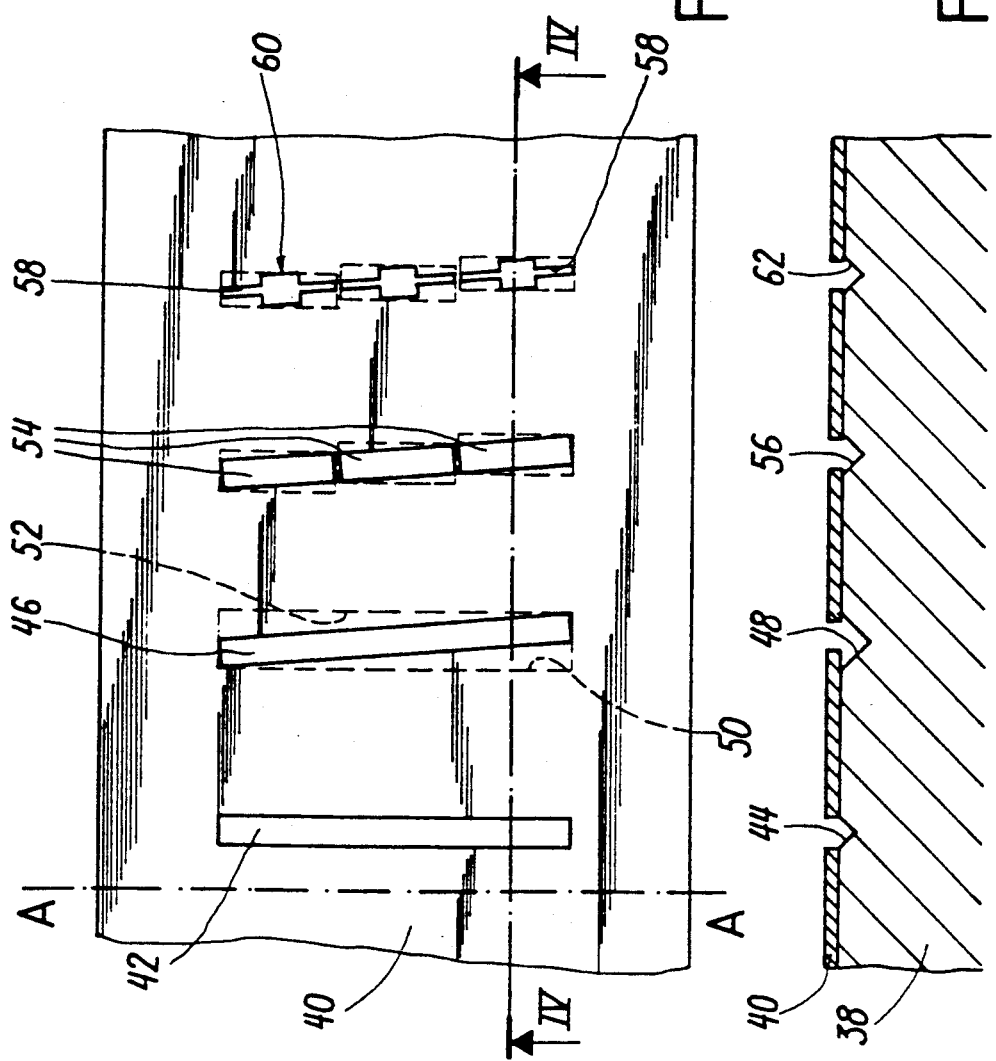
Fig.4a  Fig.4b  Fig.4c

ETCHING METHOD FOR OBTAINING AT LEAST ONE CAVITY IN A SUBSTRATE

TECHNICAL FIELD

This invention concerns an etching method for obtaining at least one cavity in a substrate and a substrate obtained by this method, such method in particular being adapted for micromachining of small plates in the micromechanical domain. The element to be etched is often a plate of semiconducting material such as a silicon wafer.

BACKGROUND OF THE INVENTION

It is sometimes necessary to provide cavities in such a wafer having a substantially flat bottom with different depths. Although it is obviously possible to obtain such cavities sequentially, it may be readily seen that such a solution is not advantageous since it requires as many masking operations and as many etching operations as there are cavities to be obtained.

U.S. Pat. No. JP-A-58/98927 describes an etching method enabling the simultaneous obtaining of cavities having different depths. This method comprises an anisotropic etching step followed by an isotropic etching step. During the first step, the cavities are formed with inclined sides, the etching stopping as soon as the sides come together. It is thus understood that the maximum depth of such a cavity is a function of the surface dimension of the latter. The second step (isotropic etching) has as effect to increase the depth of all the cavities to the same amount.

This method shows a certain number of disadvantages. First of all, it is not possible to form two cavities of the same surface area and of different depths, nor a deep cavity of small surface at the same time as a shallow cavity of large surface, since the etching speed is the same for all cavities and the maximum depth during the first step is directly proportional to the surface of the cavity.

Furthermore, this method does not enable obtaining a flat surface in all cavities, certain among them having to the contrary a V-shape bottom.

Next, this method does not enable one to control exactly the depth of all the cavities Effectively, as has been shown in FIG. 1 of the above mentioned document, if one wishes to form two cavities having different surface areas exhibiting between themselves a difference in depth less than the difference between their respective maximum depths, it is necessary to stop the etching of the cavity having the greatest surface before its maximum depth is attained. Thus, the moment when it is necessary to stop the etching may not be determined in a particularly precise manner since the etching speed can only be roughly estimated.

SUMMARY OF THE INVENTION

This invention has as its purpose to overcome the disadvantage of known etching methods. Such purpose is attained by the claimed method.

This method essentially consists in a first step of effecting an anisotropic etching through a mask partially covering the zones to be etched in order to form in each zone a set of V grooves, the depth of which depends on the width of such section. The depth of the etching in each zone is in this manner perfectly defined. In a preferred manner, the etching patterns assume the general form of rectangles. The latter are advantageously parallel to one another.

The second etching step, likewise anisotropic, increases uniformly the depth of each cavity The difference in depth between two cavities thus remains perfectly defined Such second etching step enables the obtaining in each cavity of a bottom which is substantially flat.

This may be profitably employed so as to control in a zone the thickness of a membrane or the depth of a cavity. It suffices in effect to etch during the first step such zone and another zone, referred to as the control zone, over depths such that during the second step the desired thickness for the membrane or the desired depth for the cavity are attained when the depth of the cavity in the control zone attains a precise and optically determinable value. This control depth may for instance be the thickness of the wafer or substrate.

BRIEF DESCRIPTION OF THE DRAWINGS

The characteristics and advantages of the invention will be better brought forth in the description to follow given by way of non-limiting illustration and referring to the attached drawings.

FIGS. 1a to 1e illustrate the obtaining of two cavities of different depths with the method according to the invention;

FIGS. 4a and 4b show respectively, seen from above and in cross-section, different forms of bands or rectangles capable of being employed in the first step of the method of the invention, and the grooves in V form resulting in the case of a misalignment of the bands relative to the crystallographic orientation of the wafer or substrate to be etched; and FIG. 4c is an enlarged view of a portion of a FIG. 4a.

DETAILED DESCRIPTION OF THE INVENTION

Figure 2:
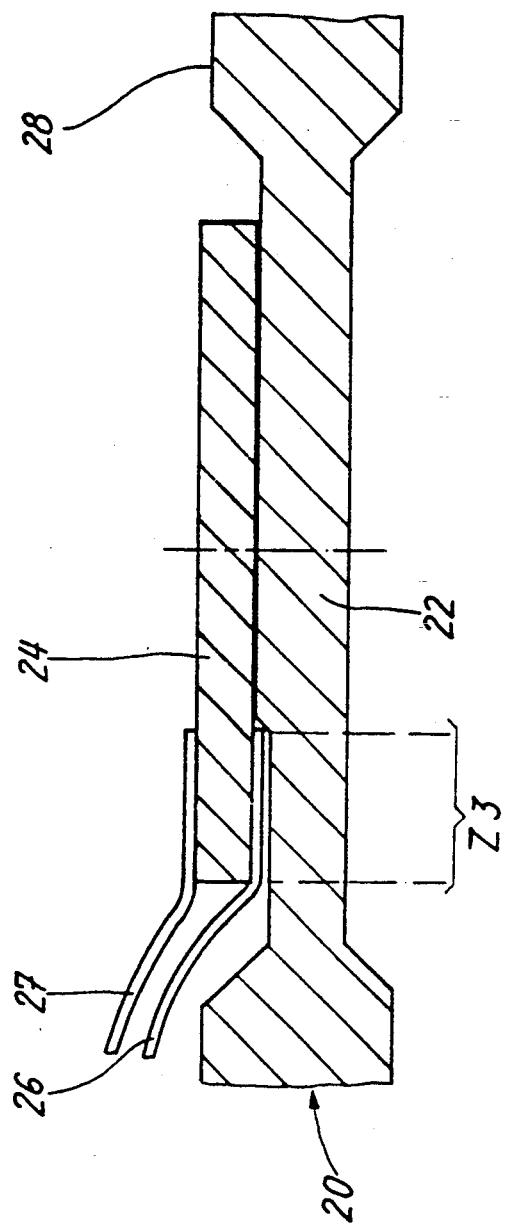
FIG. 2 shows an application of the method according to the invention.

The invention is applied in particular to micromechanics for the etching of semiconductive substrates.- The method of the invention essentially comprises two etching steps which are to be described having reference to FIGS. 1a to 1e.

A substrate 2 of monocrystalline Si of orientation <100> is covered by a mask formed from a layer 4 of $SiO_2$ (or $Si_3N_4$) of thickness 1 μm. In the zones Z1 and Z2 to be etched, this layer has been eliminated in order to leave open in each zone the etching patterns forming parallel bands 6 (zone Z1) and 8 (zone Z2), visible in cross-section on FIG. 1a. These bands may have a length equal to the dimension of the cavity to be formed in the direction perpendicular to the cross-section of the figure. They may also be clearly shorter (see FIG. 4a). The zones may have for instance a width of about 0.1 mm to 5 mm, the bands 6, 8 of about 5 to 50 μm and the bands (spacers) of $SiO_2$ 2 of about 10 to 20 μm. The number of bands 6, 8 per zones is generally in the order of 5 to 100.

The forming of the mask being well known in the technical field of the invention, there is no necessity to describe this in detail. It is simply sufficient to recall that after having formed a full layer of $SiO_2$ and a full layer of photosensitive resin, this latter is selectively insolated in order that the portions of the resin situated above bands 6 and 8 to be formed may be eliminated by dissolving in a developer solution such as xylene. Thereafter, one eliminates the unprotected part of the $SiO_2$ layer by chemical etching with a solution of $HF/NH_4F$ (the substrate 2 of Si is not attacked by this chemical agent) and one next eliminates the resin mask (FIG. 1a), for instance with a solution of $HNO_3$.

One then proceeds to the anisotropic etching of substrate 2 by chemical attack with a solution of KOH Aqueous solutions of KOH with and without 2-propanol have been employed with success. Other solutions may be used; one may in particular refer to the article "Silicon as a Mechanical Material" by K. E. Petersen, which appeared in Proceedings of the IEEE, vol. 70, Nr. 5, May 1982, pages 420–457 (in particular: table II, page 424).

One thus obtains recesses in the form of V grooves 10 (respectively 12) the width $x_1$ (respectively $x_2$) of which in zone Z1 (respectively Z2) depends on the width of the bands in such zones (FIG. 1b). As the etching stops by itself when the sides of the grooves come together, the maximum depth of the etching is strictly defined by the width of the band (to the extent that the mask is not affected in a significant manner by the etching solution). There is no risk of overetching and, consequently, one may without disadvantage leave the etching to be continued sufficiently long in order to be certain that the maximum depth is attained.

The second etching step is applied to zones Z1 and Z2 in their entirety. It is thus necessary initially to eliminate the layer 4 of $SiO_2$ covering these zones. For this, a mask of photosensitive resin is provided in a layer 14 (FIG. 1c) and the portions 16, 18 of the layer $SiO_2$ covering the zones Z1 and Z2 are eliminated by chemical attack in a solution of $HF/NH_4F$. Then, the resin mask is itself eliminated (FIG. 1d). It should be emphasized that the mask of resin does not need to be exactly positioned relative to zones Z1 and Z2. It suffices that it leaves open parts 16 and 18 of these zones.

One can then proceed to the second step of anisotropic etching of the substrate in a solution of KOH. The depth y of the etching during this step is the same in both cavities and depends directly on the etching time (FIG. 1e).

On FIG. 1e the bottom of each cavity is perfectly flat. This however is a schematic representation In reality, the etching speed being greater laterally than vertically, the grooves are enlarged little by little up to the point of coming together. In other words, the bands situated between two grooves see, little by little, their width and their height diminishing. Thereafter, the free surfaces of zones Z2 and Z2 visible on FIG. 1d become more and more planar as the etching depth y increases. However, in general, it remains possible, sometimes even with the naked eye, to distinguish undulations in the bottom of the cavities recalling the pattern of the initial mask of $SiO_2$. By way of example, it has been possible to observe undulations of around 1 $\mu m$ amplitude.

The method according to the invention enables a better control of the form of the cavity than known methods Effectively, it is known that the lateral overetching of a surface depends on the size and the form of such surface Lateral overetching is thus important with known methods in which the totality of a zone is exposed to the etching during the entire procedure. On the contrary, in the method according to the invention, the first etching step is applied to etching patterns much smaller than a zone. Thus, whatever the form of the zone to be etched, lateral overetching is limited during the first step of the etching. This may be advantageously employed in order to form a cavity or a hole for which one wishes to have a good control of the dimension.

The method described having reference to FIGS. 1a to 1e enables one to obtain simultaneously at least two cavities having different depths and for which the difference between such depths, equal to $x_1 - x_2$, is defined with great precision. Let us note that approximately the same result could be obtained in etching zone Z2 only during the second step of the etching. It is sufficient for this to form grooves in Z1 having a depth of $x_1 - x_2$, during the first etching step and to etch the two zones Z1 and Z2k over a depth of $x_2 + y$, during the second etching step.

It should be further noted that the different etched zones may be distant from one another, as shown on FIGS. 1a to 1e, or contiguous. In the latter case, one obtains a single cavity exhibiting portions having different depths.

FIG. 2 illustrates an application of the method of the invention. A substrate 20 of monocrystalline Si of orientation <100> and of a thickness of 200 $\mu m$ is machined by chemical attack in order to form a membrane 22 of 8 mm diameter and of 100 $\mu m$ thickness. A piezoelectric disc 24 provided on each side with a conductive element each of which forms an electrical conductor 26, 27 is glued onto one of the sides of the membrane. One may thus cause a strain in the membrane (movement along the axis perpendicular to the plane of the membrane). This type of membrane is in particular employed in micropumps intended in the medical domain for the injection of medicaments in solution, the principle of which is described in the article "A piezoelectric Micropump Based On Micromachining of Silicon" by H. van Lintel et. al. which appeared in Sensors and Actuators, vol. 15, 1988, pages 153–167.

As may be seen on FIG. 2, local overetching is brought about in zone Z3 of the membrane in order to take into account the extra thickness formed by electrical conductor 26. It would be possible to avoid such overetching by gluing an electrical conductor 26 covering completely the piezoelectric disc, but there would then be, between the piezoelectric disc and the membrane, a first layer of glue, the electrical conductor, and a second layer of glue, which would bring about a dispersion of the motion characteristics between different membranes during utilization of the latter.

The etching of the upper surface 28 (that on which the piezoelectric disc will be glued) of substrate 20 is effected in two steps in accordance with the invention. It should be noted that the lower surface is also etched in this particular case.

In the first step, only zone Z3 is subjected to etching; this etching is effected through a mask leaving open a set of parallel bands in order to produce a set of V-grooves. In the second step, the etching is effected through a mask leaving open the totality of the surface of membrane 22 to be obtained. The depth of the V-grooves defines the depth of the cavity of zone Z3 relative to the membrane.

The method of the invention may also be employed in order to control the depth of etching and to assure thus that the cavities have exactly the desired depth and/or that the membranes have exactly the desired thicknesses.

Let us suppose one wishes to form a cavity of depth $y_4$ in a zone Z4 of a substrate having a thickness e. For this one will create a control cavity in a zone Zc according to the method of the invention.

Figure 3A:
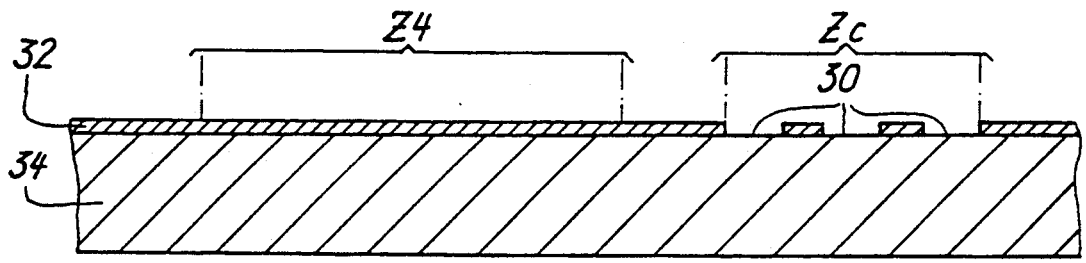
FIGS. 3a to 3d show how the depth of a cavity or the thickness of a membrane may be controlled by the method according to the invention.
Figure 3B:
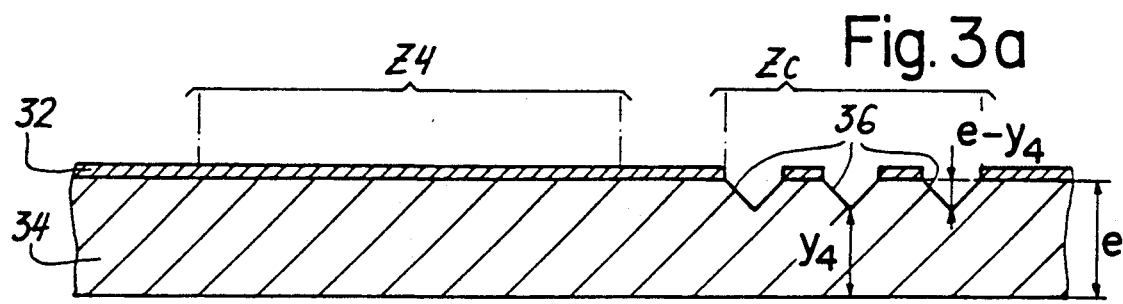

One thus forms in the control zone Zc a mask leaving uncovered a set of parallel bands 30 (FIG. 3a). Such mask is formed for instance in a layer 32 of $SiO_2$ in the case of a substrate 34 of monocrystalline Si. The width of these bands is chosen in order that through anisotropic etching the depth of the V-grooves 36 formed in zone Zc is equal to $e-y_4$ (FIG. 3b).

Figure 3C:
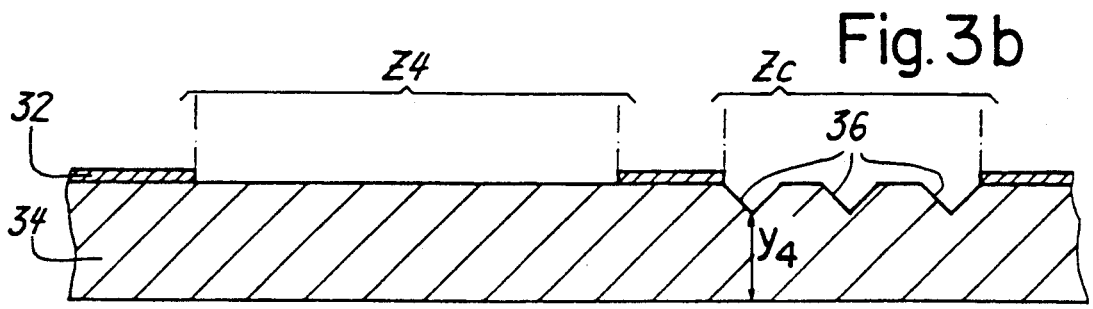
Figure 3D:
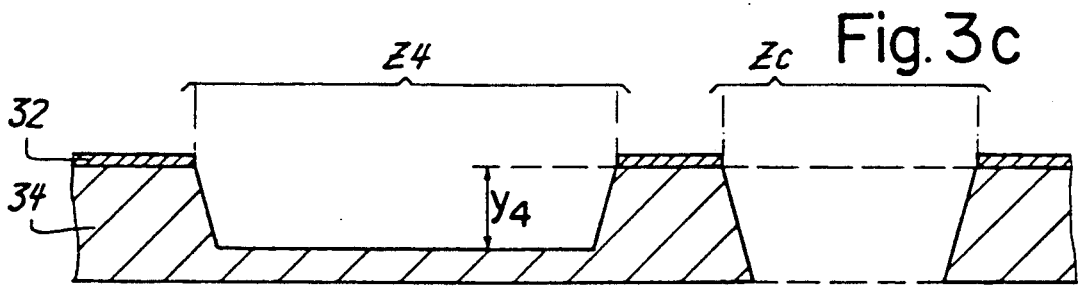

One then eliminates the protective layer 32 above zones Z4 and Zc (FIG. 3c) and one proceeds with the anisotropic etching of the latter. The depth $y_4$ is attained in zone Z4 approximately at the same instant as a hole is formed in the control zone Zc (FIG. 3d). This instant is thus easily detectable by visually observing the control zone Zc.

The same method may be employed in order to obtain a membrane of a given thickness E. It is sufficient in effect to form grooves in the control zone of sufficient depth, substantially equal to E (the precise value depends on several parameters including the nature of the etching substance) during the first etching step. Thus, during the second etching step, a hole is formed in the control zone Zc when the thickness of the membrane is equal to the desired value E. It should be noted that it is not necessary to know the thickness e of the substrate in order to obtain the desired membrane according to this method.

Instead of detecting the formation of a hole, one could also detect, for instance just before the hole is formed, a change in colour of the membrane in the control zone Zc and/or a variation of the transparency of the membrane in this zone.

A method is known in which a single groove is etched in the control zone Zc, the dimension of this zone being chosen in order that the depth of the groove corresponds to the thickness of the membrane. The optical detection of the end of the principal etching according to the known method, which is effected from the side of the substrate opposite to that in which the control groove is etched, is much more difficult since, instead of forming a hole, as in the method of the invention, one must detect a simple slot.

In the method described having reference to FIGS. 3a to 3d zone Z4 is etched only during the second etching step. One may however also etch this zone during the first etching step in order to form V-grooves therein It is sufficient simply to choose the width of the bands to be etched in zone Z4 and Zc in such a manner that the difference between the depth of the grooves in the control zone Zc and the depth of the grooves in zone Z4 are equal to the 0 residual thickness which one wishes to obtain in zone Z4 after the second etching step. On FIG. 3b, where only the control zone is etched during the first etching step, the depth of the groove is thus equal (in practice about equal) to the residual thickness of zone Z4 on FIG. 3d).

One also finds in the article "An IC Piezoresistive Pressure Sensor For Biomedical Instruments" by Samaun et. al. published in IEEE Transactions on Biomedical Engineering, vol BME-20, Nr 2, Mar. 1973, pages 101-107 (particularly FIG. 6) a method in which a wafer is etched on one side in order to form a membrane and the other side of which is simultaneously etched in order to form a frame surrounding the membrane, each side of the frame being a V-groove, the depth of which is equal to the desired thickness of the membrane. When the thickness of the membrane attains the depth of the V-grooves, the portion of the wafer inside the frame falls away, leaving a hole of large dimensions readily visible.

With this known method, there is no indication enabling one to observe that one is close to the instant when the etching must be stopped.

Furthermore, in order that the hole appear and be visible at the end of the etching, it is necessary that each side of the frame be formed with a single groove having a substantial length (the latter is in the order of a millimeter).

It has been assumed up to the present that the width of the V-grooves was equal to the width of the bands left uncovered by the protection mask, i.e. the width of the sides of the frame. This is exact when the direction of the bands is strictly oriented at 45° (line A—A on FIG. 4a) relative to the two crystallographic axes which define the plane of a Si plate of <100> orientation. On the other hand, the grooves are wider than the bands and consequently deeper than foreseen if the bands are not perfectly at 45° relative to such axes. The method described in this article does not permit in this case a good control of the thickness of the membrane to be formed.

To the contrary, the method of the invention enables one to avoid the consequences of a poor alignment. The effects of a poor alignment appear clearly on FIGS. 4a and 4b which show respectively, seen from above and in cross-section along line IV—IV a substrate 38 covered by a mask 40 in which bands having different forms and orientations have been provided.

Band 42 is perfectly parallel to line A—A. The V-groove 44 formed by anisotropic etching has thus exactly the width of this band.

On the other hand, band 46 is not perfectly parallel to line A—A. The V-groove 48 is then wider than band 44 because of etching under layer 40 up to the edges 50, 52. There also results therefrom a depth of groove greater than desired.

It is noted that the enlarging of the groove depends on the length of the band. One may reduce this phenomenon of enlarging and consequently deepening of the grooves by replacing the band 46 by a series of disjointed bands 54. One then obtains V-grooves 56 the enlarging of which, relative to groove 44, is less than with the band 48.

One may further reduce this enlarging by diminishing the width of the end portions 58 of band 60. The width of each groove 62 is thus fixed by the width of the central portion 64 of the segments.

As may be seen on FIG. 4c which shows a band 60 in enlarged form, the width of the groove is reduced on each side by a value d relative to the groove obtained with a band 54.

The increase of the width of groove 62 relative to groove 44 then becomes almost negligible. The same follows in respect to the increase of the depth.

What is claimed is:

1. An etching method for obtaining at least one cavity in a layer, said method comprising:
   a first step of anisotropic etching of said layer in at least one zone in which a cavity is to be formed through an etching pattern of a first mask partially covering said zone so as to form in said zone a set of V-grooves extending into said layer in a direction perpendicular to a surface of said layer, the depths of said V-grooves being defined by the etching pattern of said first mask; and, a second step of anisotropic etching of said layer through a second mask leaving said zone fully exposed so as to form said cavity in said zone, said cavity having a total depth which depends on the depths of the V-grooves formed in said zone during said first etching step.

2. An etching method as set forth in claim 1, wherein said second etching step is continued at least until the depth of the cavity in at least one zone is equal to the thickness of said layer.

3. An etching method as set forth in claim 2, wherein at least one zone, referred to as the control zone, is used to control the progress or the result of the etching in at least one other zone, said grooves being formed in at least one control zone during said first etching step and the progress or the result of the etching being checked by optical detection of the thickness of the layer in said at least one control zone during or after said second etching step.

4. An etching method as set forth in claim 3 wherein the grooves formed in each control zone during said first etching step have a depth such that the optical detection of the layer thickness in said at least one control zone during or after said second etching step yields a check on 9 thickness of a membrane formed in said at least one other zone.

5. An etching step as set forth in claim 4 wherein the formation of holes through said layer is detected in at least one of the control zones.

6. An etching step as set forth in claim 3 wherein the formation of holes through said layer is detected in at least one of the control zones.

7. An etching method as set forth in claim 1, wherein a portion of said at least one cavity formed during said second etching step encompasses and is of greater span than a corresponding portion of the zone etched during said first etching step.

8. An etching method as set forth in claim 7, wherein at least one zone, referred to as the control zone, is used to control the progress or the result of the etching in at least one other zone, said grooves being formed in at least one control zone during said first etching step and the progress or the result of the etching being checked by optical detection of the thickness of the layer in said at least one control zone during or after said second etching step.

9. An etching method as set forth in claim 8 wherein the grooves formed in each control zone during said first etching step have a depth such that the optical detection of the layer thickness in said at least one control zone during or after said second etching step yields a check on a thickness of a membrane formed in said at least one other zone.

10. An etching step as set forth in claim 9 wherein the formation of holes through said layer is detected in a at least one of the control zones.

11. An etching step as set forth in claim 8 wherein the formation of holes through said layer is detected in at least one of the control zones.

12. An etching method as set forth in claim 1, wherein at least one zone, referred to as the control zone, is used to control the progress or the result of the etching in at least one other zone, said grooves being formed in at least one control zone during said first etching step and the progress or the result of the etching being checked by optical detection of the thickness of the layer in said at least one control zone during or after said second etching step.

13. An etching method as set forth in claim 12, wherein the grooves formed in said control zone during said first etching step have a depth such that a optical detection of the layer thickness in said at least one control zone during or after said second etching step yields a check on the thickness of a membrane formed in said at least one other zone.

14. An etching method as set forth in claim 13, wherein said grooves are also formed in at least one of said other zones during said first etching step.

15. An etching method as set forth in claim 12, wherein the formation of a hole through said layer is detected in said control zone.

16. An etching as set forth in claim 1, wherein the etching patterns of the mask employed in said first step have the general form of rectangles.

17. An etching method as set forth in claim 1, wherein the etching patterns of the mask employed in said first step have end portions of lesser width than their central portion.

18. An etching method as set forth in claim 1, wherein the layer to be etched is of monocrystalline Si of $<100>$ orientation and the etching mask is of $SiO_2$ or $Si_3N_4$.

19. An etching method as set forth in claim 1, wherein said cavity has a bottom which is substantially flat.

20. An etching method as set forth in claim 1, wherein said first etching step forms a first set of V-grooves in a first zone and a second set of V-grooves in a second zone, wherein the depths of the V-grooves of said first set are substantially greater than the depths of the V-grooves of said second set, wherein said second etching step forms a first cavity in said first zone and second cavity in said second zone, and wherein the total depth of said first cavity is substantially greater than the total depth of said second cavity.

* * * * *

UNITED STATES PATENT AND TRADEMARK OFFICE
CERTIFICATE OF CORRECTION

PATENT NO. : 5,316,618

DATED : May 31, 1994

INVENTOR(S) : Harald T.G. van LINTEL

It is certified that error appears in the above-identified patent and that said Letters Patent is hereby corrected as shown below:

On the title page:

In the ABSTRACT, line 7, before "$X_1$," insert --(--.

Column 7, line 29, change "9" to --a--.

Signed and Sealed this

Thirteenth Day of September, 1994

Attest:

*Attesting Officer*

BRUCE LEHMAN

*Commissioner of Patents and Trademarks*